United States Patent [19]
Suzuki

[11] Patent Number: 5,834,790
[45] Date of Patent: Nov. 10, 1998

[54] VACUUM MICRODEVICE

[75] Inventor: Kenichiro Suzuki, Tokyo, Japan

[73] Assignee: Nec Corporation, Tokyo, Japan

[21] Appl. No.: 824,610

[22] Filed: Mar. 27, 1997

[30]    Foreign Application Priority Data

Mar. 27, 1996  [JP]  Japan ..................................... 8-071905

[51] Int. Cl.⁶ ................................................. H01L 29/06
[52] U.S. Cl. ........................... 257/10; 313/309; 313/310; 438/20
[58] Field of Search .............................. 257/10; 313/309, 313/310, 311; 438/20

[56]    References Cited

U.S. PATENT DOCUMENTS

| | | | |
|---|---|---|---|
| 4,307,507 | 12/1981 | Gray et al. ................................. | 29/580 |
| 5,394,006 | 2/1995 | Liu .......................................... | 257/506 |
| 5,499,938 | 3/1996 | Nakamoto .................................. | 445/50 |
| 5,572,041 | 11/1996 | Betsui et al. .............................. | 257/10 |
| 5,580,827 | 12/1996 | Akamine .................................. | 437/225 |

FOREIGN PATENT DOCUMENTS 6-36682  7/1992  Japan .

*Primary Examiner*—Olik Chaudhuri
*Assistant Examiner*—Douglas A. Wille
*Attorney, Agent, or Firm*—Foley & Lardner

[57]    ABSTRACT

A vacuum microdevice having a field-emission cold cathode includes a first electrode having a projection portion formed on its surface, the projection having a sharp tip, an insulating film formed in the region of the first electrode, excluding the sharp tip of the projection portion, a second electrode formed in a region on the insulating film, excluding the sharp tip of the projection portion, to planarize the surface of the second electrode, and a structural substrate bonded to the lower surface of the first electrode and having a recess portion in the bonding surface with the lower surface of the first electrode, the recess portion having a size large enough to cover a recess reflecting the sharp tip of the projection portion formed on the lower surface of the first electrode. The interior of the recess portion formed in the structural substrate communicates with the atmosphere outside the device. A support structure is formed on the surface of the second electrode to surround each projection portion formed on the first electrode. With this structure, a vacuum microdevice which can suppress variations in characteristics due to voids, and exhibit excellent long-term reliability can be provided.

10 Claims, 9 Drawing Sheets

VACUUM MICRODEVICE

BACKGROUND OF THE INVENTION

1. Field of the Invention

The present invention relates to a vacuum microdevice and, more particularly, to a field-emission cold cathode used for a minute microwave vacuum tube, a minute display element, or the like.

2. Description of the Prior Art

A minute field-emission cold cathode can be manufactured by using the silicon semiconductor technique. A few methods using this technique are known. In order to improve the function of a field-emission cold cathode, emitter electrodes need to have sharp tips, and the respective emitter electrodes must be uniformly shaped. In addition to such requirements for shape and the like, requirements for material and the like must be satisfied. For example, an emitter material which has a small work function and does not change easily with an environmental change must be used. For this reason, a great deal of attention has been paid to a manufacturing method using the principle of the mold method of forming a recess portion with a sharp pointed bottom in a silicon substrate, filling the recess portion with an emitter material, and separating the silicon substrate from the emitters.

A field-emission cold cathode manufacturing method using this mold method was reported first in H. F. Grey et al., "Method of Manufacturing a Field-Emission Cathode Structure" (U.S. Pat. No. 4,307,507). The mold method is characterized in that many minute recesses can be uniformly formed in a silicon substrate, only a simple process of filling the recesses with an emitter material is required, and various emitter materials can be used.

According to the manufacturing method patented to H. F. Grey et al., since a thin emitter film is not strong enough to allow the emitter to be properly separated from the silicon substrate, a thick emitter must be formed. It therefore takes much time to manufacture the emitter. In addition, this method requires a technique of controlling large stress left in the emitter material.

A method of reinforcing this thin emitter film by bonding it to a structural substrate with a sufficient strength is one method of manufacturing a cold cathode device using a thin emitter film. A technique of manufacturing a device with a triode structure by using this method is disclosed in Nakamoto et al., "Method of Manufacturing a Field Emission Cold Cathode, Field Emission Cold Cathode Manufactured by such Method, and Flat Image Display" (Japanese Unexamined Patent Publication No. 6-36682). This conventional technique will be described below with reference to FIGS. 1 and 2.

FIG. 1 is a sectional view showing the structure of a device 2 having a field-emission cold cathode manufactured by the mold method, which is disclosed in Japanese Unexamined Patent Publication No. 6-36682. As shown in FIG. 1, an emitter electrode 101 having sharp tips is formed in current radiation regions 104 on a glass substrate 100. A gate electrode 103 is formed on the emitter electrode 101 through an oxide film 102. Note that voids 105 are present in the space between the emitter electrode 101 and the glass substrate 100.

The operation of a field-emission cold cathode of the device 2 will be described next. When a voltage of about 100 V is applied between the gate electrode 103 and the emitter electrode 101, since each tip of the emitter electrode 101 is sharp, a strong electric field of about $10^9$ V/cm is generated in the current radiation region 104. Owing to this strong electric field, electrons are emitted from the tip of the emitter electrode 101. Since the current radiation region 104 is designed to generate such a strong electric field, the shapes of the emitter electrode 101 and the gate electrode 103 need to be controlled with high precision.

FIGS. 2A to 2F are sectional views sequentially showing the steps in a method of manufacturing the field-emission cold cathode having the structure shown in FIG. 1. First of all, as shown in FIG. 2A, holes 116, each having a size of about 1 $\mu$m×1 $\mu$m×0.7 $\mu$m, are formed in the upper surface of a silicon substrate 110 by using an oxide film 111 as a mask. These holes can be easily formed in the shape of an inverted quadrangular pyramid by etching the silicon substrate using KOH. As shown in FIG. 2B, the silicon substrate 110 is oxidized to form an oxide film 112 having a thickness of about 300 nm in the holes 116. An emitter metal 113 is then deposited on the oxide film 112 to a thickness of about 1 $\mu$m. When the oxide film 112 is formed in the holes 116 before the deposition of the emitter metal 113, the shape of the bottom of each hole 116 can be sharpened.

The subsequent steps will be described with reference to FIGS. 2C to 2F. Note that the structure shown in FIGS. 2C to 2F is in an inverted position with respect to the structure shown in FIGS. 2A and 2B.

As shown in FIG. 2C, after the emitter metal 113 and the glass substrate 100 are bonded to each other by electrostatic bonding, the resultant sample is dipped in a KOH etching solution to completely remove the silicon substrate 110. KOH has an etching rate of an oxide film about 100 times that of a silicon film. For this reason, the structure shown in FIG. 2C can be obtained.

As shown in FIG. 2D, after a gate metal 114 is deposited on the sample to a thickness of about 1 $\mu$m by sputtering, the surface of the gate metal 114 is coated with a resist 115. In general, molybdenum is used for the emitter metal 113 and the gate metal 114. As shown in FIG. 2E, the resist 115 is back-etched by a dry etching unit under the condition that the entire sample surface is etched at a constant rate. This back etching is stopped when the oxide film 112 in each region 117 in which a sharp tip is formed is exposed. Thereafter, as shown in 2F, the resist 115 is removed first, and the sample is then dipped in an HF solution to etch the oxide film 112 exposed in the region 117. In this manner, each tip of the emitter metal 113 serving as an emitter electrode can be exposed.

In the conventional technique shown in FIGS. 1 and 2, however, the following problems are posed. As shown in FIG. 1, the voids 105 are present in the space between the emitter electrode 101 and the glass substrate 100 below the current radiation regions 104. These voids 105 are present for the following reason. In the step shown in FIG. 2B, when the emitter metal 113 is deposited in the holes 116 (see FIG. 2A), recesses 106 are formed in the emitter metal 113, reflecting the shapes of the hole 116. In the step shown in FIG. 2C, the glass substrate 100 and the emitter metal 113 are bonded to each other while the recesses 106 are formed. The presence of the voids 105 makes it difficult to manufacture a device using this type of field-emission cold cathode, and causes a deterioration in the characteristics of the manufactured device, as will be described below.

First, as described in the step shown in FIG. 2C, after the emitter metal 113 is deposited, the silicon substrate 110 is bonded to the glass substrate 100 by electrostatic bonding. In the electrostatic bonding, the bonding surfaces of the two substrates are brought into contact with each other and bonded to each other in an atmosphere heated to about 400° C. In this case, the air in each void 105 is heated, and hence expands to increase the pressure in the void 105. This increase in pressure produces a force that acts to separate the bonding surfaces of the two substrates from each other, making it difficult to bond the two substrates. For this reason, according to the conventional technique, to bond the two substrates, an electrostatic force (attractive force) that overcomes the force acting to separate the bonding surfaces from each other is applied thereto, and the bonding time is prolonged. It is, however, difficult to uniformly bond the entire surfaces of the substrates to each other. Therefore, the manufactured device chip inevitably has some non-bonded regions in which the emitter metal 113 is not bonded to the glass substrate 100.

Second, as shown in FIG. 2C, after the two substrates (the silicon substrate 110 and the glass substrate 100) are bonded to each other, the silicon substrate 110 is completely removed by wet etching except for the emitter metal 113 having a thickness of about 1 $\mu$m and the oxide film 112 having a thickness of about 300 nm. In the process of silicon etching actually performed, the etching solution (KOH) for silicon was heated to about 110° C., and hydrogen bubbles were vigorously produced from the silicon surface owing to the etching reaction of silicon. In this case, the structure constituted by thin films, i.e., the emitter metal 113 and the oxide film 112, was often damaged by the hydrogen bubbles. This is because, the expansion of the air in each void 105 and the presence of the non-bonded regions between the thin film and the glass substrate 100, in addition to the residual pressure in the thin film, produce large stress on the thin film structure.

Third, as described in the step shown in FIG. 2D, in order to deposit the gate metal 114 on the sample manufactured in the step shown in FIG. 2C, the sample must be placed in a vacuum unit. In this case, the thin film structure constituted by the emitter metal 113 and the oxide film 112 may be damaged by the pressure of the air trapped in each void 105.

Fourth, the presence of the voids 105 adversely affects the characteristics of the manufactured device as well, as will be described below, in addition to various problems posed in the device manufacturing process.

Referring to FIG. 1, the shape of the tip of the emitter electrode 101 in each current radiation region 104, the shape of the gate electrode 103 around this tip, and the relative positional relationship between each tip of the emitter electrode 101 and the gate electrode 103 are critical to the characteristics of the field-emission cold cathode device. It is therefore required to control these shapes with high precision. However, the pressure of the air trapped in each void 105 below the current radiation region 104 cannot be controlled in the device manufacturing process. For this reason, the pressure of the air trapped in the respective voids 105 varies depending on the devices or current radiation regions (many current radiation regions are often formed in one chip).

Since the emitter electrode 101 and the oxide film 102 which keep air trapped in the voids 105 are thin films, the shape of each current radiation region 104 changes depending on the magnitude of the pressure of the trapped air. For this reason, the device characteristics vary depending on the devices or current radiation regions. In addition, since the production and positions of non-bonded regions between the thin film and the glass substrate 100 cannot be controlled, the thin film structure may not be bonded to the glass substrate 100 near a ceratin current radiation region. If a voltage of a high electric field is applied to this non-bonded region, the emitter electrode 101 may peel off from the glass substrate 100.

Fifth, to stably drive the device shown in FIG. 1, it is mounted in a package to be placed in a vacuum atmosphere of about $10^{-5}$ Torr or less. When this packaging is to be performed, the device is baked at about 400° C. to evaporate moisture and the like adhering to the device and the package. In this baking step, the air trapped in each void 105 expands to change the shape of the current radiation region 104. This change in shape remains even after a cooling process. Furthermore, the non-bonded regions and the like may be damaged while the device is driven. In this case, the trapped air is discharged into the package to decrease the degree of vacuum in the package, resulting in a deterioration in device characteristics. For this reason, the device having the conventional structure in FIG. 1 has poor long-term reliability.

In addition to the above problems, the sixth problem is posed. That is, the conventional structure shown in FIG. 1 gives no indication as to the structure for connecting the gate and emitter electrodes to the pins of the package, and supplying electrical signals to the electrodes. The means of supplying electrical signals is a big factor that limits the application range of the device. A study on this means is therefore critical to the actual applications of the device.

SUMMARY OF THE INVENTION

It is an object of the present invention to provide a structure for supplying electrical signals to the gate and emitter electrodes of a field-emission cold cathode, and a vacuum microdevice which suppresses variations in characteristics due to the presence of voids, and has excellent long-term reliability.

In order to achieve the above object, according to the present invention, there is provided a vacuum microdevice comprising a first electrode having a projection portion formed on a surface thereof, the projection having a sharp tip, an insulating film formed in a region of the first electrode, excluding the sharp tip of the projection portion, a second electrode formed in a region on the insulating film, excluding the sharp tip of the projection portion, to planarize a surface of the second electrode, and a structural substrate bonded to a lower surface of the first electrode and having a recess portion in a bonding surface with the lower surface of the first electrode, the recess portion having a size large enough to cover a recess reflecting the sharp tip of the projection portion formed on the lower surface of the first electrode.

According to this arrangement, since the recess portion having a size larger enough to cover the recesses reflecting the tips of the projection portions formed on the lower surface of the emitter electrode is formed in the structural substrate to which the emitter electrode as the first electrode is bonded, the emitter electrode and the structural substrate are bonded to each other at the peripheral portion of the recess portion, but the emitter electrode below the respective current radiation regions is not bonded to the structural substrate. For this reason, the conventional problem of variations, i.e., the presence of bonded and non-bonded portions in the respective current radiation regions, can be solved. In addition, the device is constituted by a thick three-layered structure (e.g., about 2.3 $\mu$m) consisting of an emitter electrode, an oxide film, and a gate electrode serving as a second electrode. Since the mechanical rigidity is proportional to the cube of thickness, the strength of this structure can be greatly increased. For example, the rigidity of this structure is 5.5 times that of the structure of the conventional device.

In the structure of the above vacuum microdevice, the interior of the recess portion formed in the structural substrate preferably communicates with the atmosphere outside the device. With this arrangement, the difference in pressure between the interior of the recess portion and the outside of the device is eliminated. As a result, in the manufacturing process, the structural substrate and the silicon substrate can be easily bonded to each other. When a 4 inch silicon wafer is to be actually bonded to a 4 inch glass substrate at 300° C. with a voltage of 250 V, all the regions can be bonded to each other within five minutes. In addition, since there is no trapped air layer, the thin film structure is not damaged by the expansion of an air layer. Furthermore, since there is no trapped air layer in the device, a decrease in the degree of vacuum of the package can be prevented, which is encountered when the device is damaged after it is mounted.

In the structure of the above vacuum microdevice, a support structure is preferably formed on a surface of the second electrode to surround the projection portion formed on the first electrode. By forming the thick support structure (e.g., about 100 μm) around the thick three-layered structure consisting of the emitter electrode, the oxide film, and the gate electrode, the mechanical strength of the device can be greatly increased, thereby preventing the device from being damaged in the manufacturing process.

In addition, the support structure preferably consists of a semiconductor and has a (111) side surface. With this structure, a taper can be formed on the inner side of the support structure so as not to interfere with the flow of electrons emitted from the current radiation regions.

The support structure is preferably made of part of an impurity diffusion layer forming the second electrode. In this case, since the manufacturing process includes no photolithographic step for the lower surface of the silicon substrate, the manufacturing process can be simplified. In addition, since the thickness of the support structure can be controlled by controlling the depth of diffusion, the area occupied by the support structure can be reduced.

The structural substrate preferably comprises a glass substrate because the structural substrate and the emitter electrode can be firmly bonded to each other by electrostatic bonding.

As a structure for supplying electrical signals in the vacuum microdevice of the present invention, there is provided a structure in which the first electrode is connected to a metal electrode formed on the structural substrate, the second electrode is connected to another metal electrode formed on the structural substrate through a hole formed in the insulating film, and electrical signals are supplied to the first and second electrodes through the metal electrodes, a structure in which portions of the first and second electrodes are extended outward to be exposed on a surface side different from a surface to which the structural substrate is bonded, and electrical signals are supplied to the first and second electrodes through the exposed regions, or a structure in which a portion of the second electrode is extended to be exposed on a surface side different from a surface to which the structural substrate is bonded, an electrical signal is supplied to the second electrode through the exposed region, and an electrical signal is supplied to the first electrode through the support structure formed on the first electrode.

As described above, various means for supplying electrical signals to the emitter and gate electrodes of a device mounted in a package are available. Therefore, the size and the like of the package can be changed in accordance with various practical applications, increasing the degree of freedom in design.

According to another aspect of the present invention, there is provided a vacuum microdevice comprising a first electrode having a projection portion formed on a surface thereof, the projection having a sharp tip, an insulating film formed in a region of the first electrode, excluding the sharp tip of the projection portion, and a second electrode formed in a region on the insulating film, excluding the sharp tip of the projection portion, to planarize a surface of second electrode, wherein electrical signals are supplied to an electrode formed on the first electrode and an electrode separated from the first electrode and connected to the second electrode. According to this aspect, the structural substrate need not be bonded to the emitter electrode, and hence the structure of the device can be simplified.

DETAILED DESCRIPTION OF PREFERRED EMBODIMENTS

The present invention will be described below with reference to the accompanying drawings.

Figure 3:
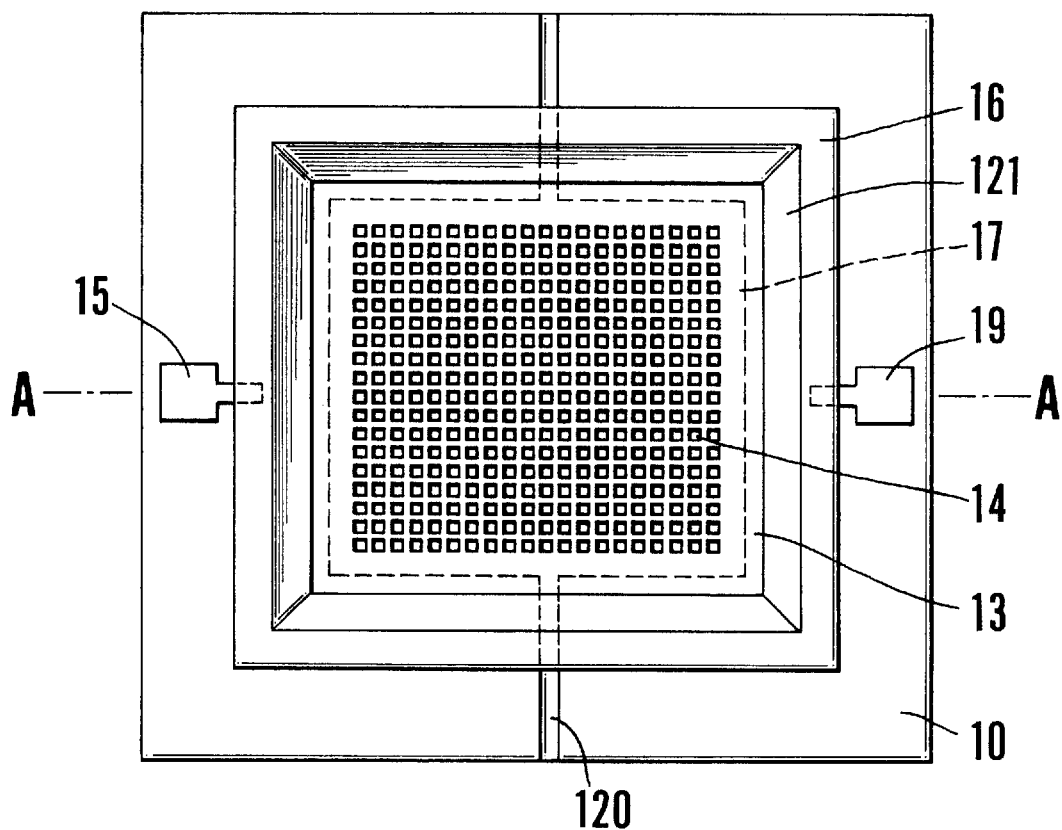
FIG. 3 is a plan view showing the structure of a vacuum microdevice having a field-emission cold cathode according to the first embodiment of the present invention.
Figure 4:
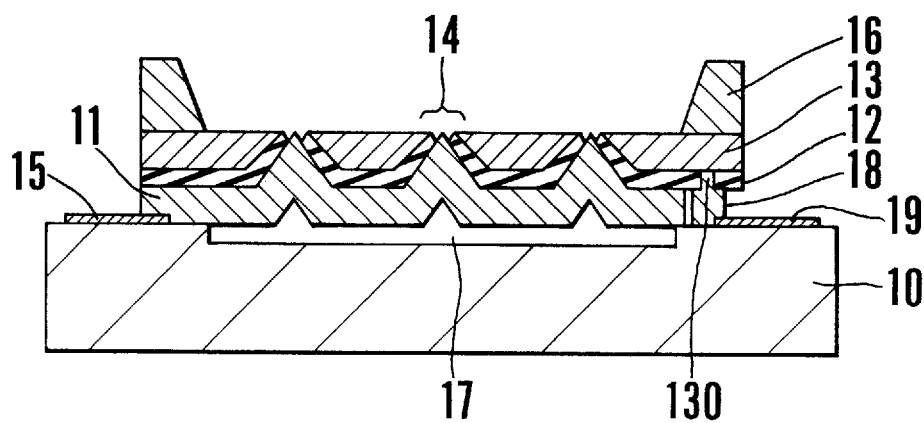
FIG. 4 is a sectional view taken along a line A—A in FIG. 3.

FIG. 3 is a plan view showing the structure of a vacuum microdevice having a field-emission cold cathode according to the first embodiment of the present invention. FIG. 4 is a sectional view taken along a line A—A in FIG. 3. As shown in FIG. 4, an emitter electrode 11 is formed on a structural substrate 10 such as a glass substrate having a thickness of, e.g., 0.5 mm. The lower surface of the emitter electrode 11 is bonded to the structural substrate 10. Portions having sharp tips are formed on the upper surface of the emitter electrode 11. A gate electrode 13 is formed on the upper surface of the emitter electrode 11 with an insulating film 12 between. The emitter electrode 11 consists of a material having a small work function such as molybdenum, tantalum, titanium, molybdenum nitride, tantalum nitride, titanium nitride, polysilicon, $LaB_6$, or a diamond film. The emitter electrode 11 has a thickness of, for example, about 1 μm. Each sharp tip of the emitter electrode 11 has a curvature radius of 10 nm or less.

The insulating film 12 is an oxide or nitride film or consists of an oxide or nitride of the emitter electrode material. For example, the insulating film 12 has a thickness of about 0.3 μm. The gate electrode 13 consists of silicon doped with an impurity and having a low resistance or the like. For example, the gate electrode 13 is a p- or n-type silicon layer having a thickness of about 1 μm. A current radiation region 14 is formed near each sharp tip of the emitter electrode 11. In this region, the gate electrode 13 and the insulating film 12 are partly removed to expose the sharp tip of the emitter electrode 11.

Figure 1:
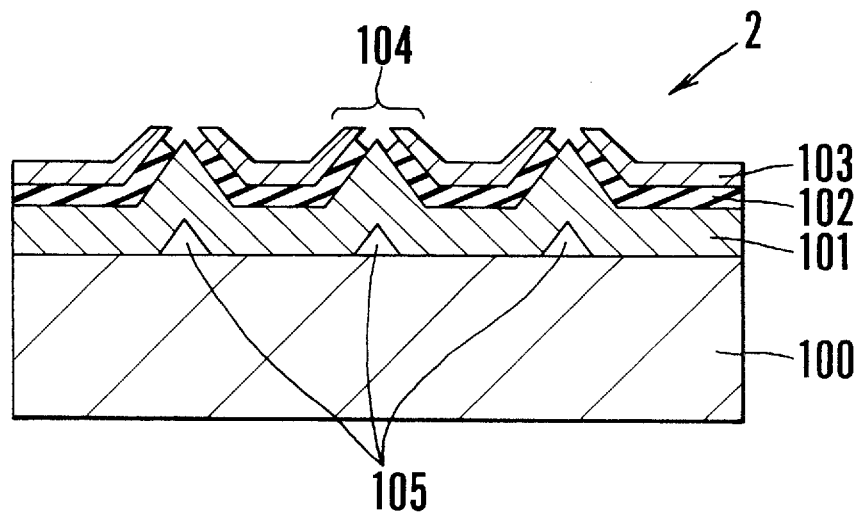
FIG. 1 is a sectional view showing the structure of a conventional vacuum microdevice having a field-emission cold cathode mnufactured by the mold method.
Figure 2A:
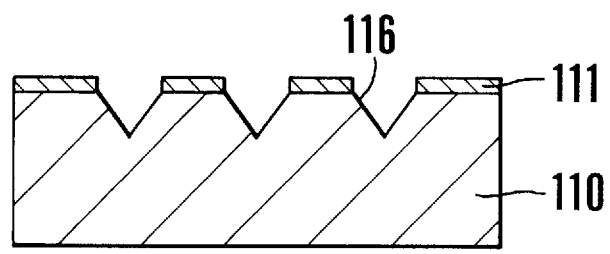
FIGS. 2A to 2F are sectional views sequentially showing the steps in a method of manufacturing the device in FIG. 1.
Figure 2B:
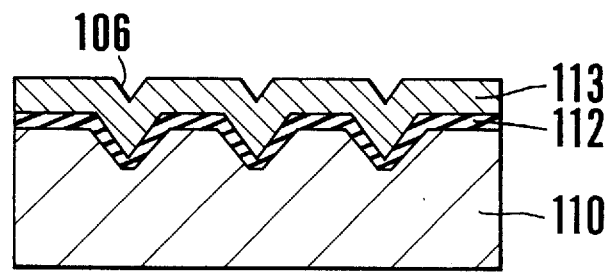
Figure 2C:
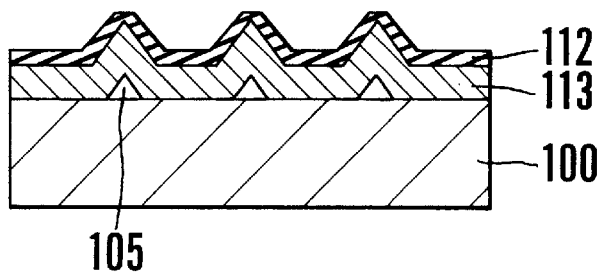
Figure 2D:
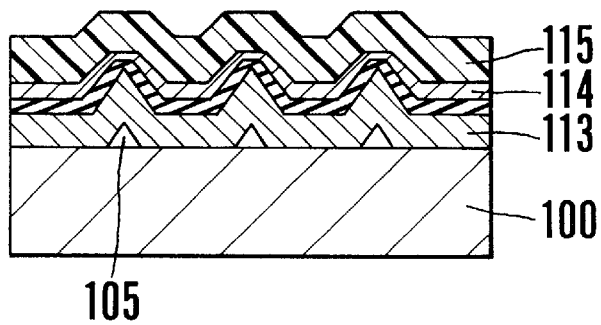
Figure 2E:
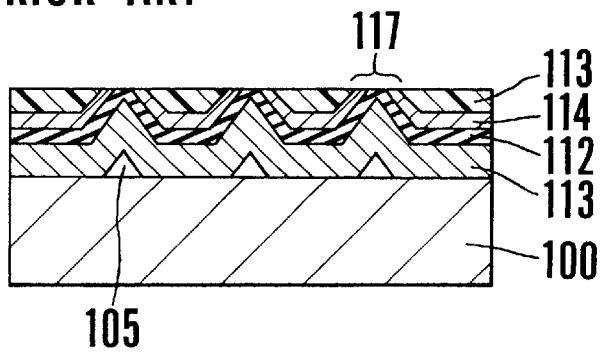
Figure 2F:
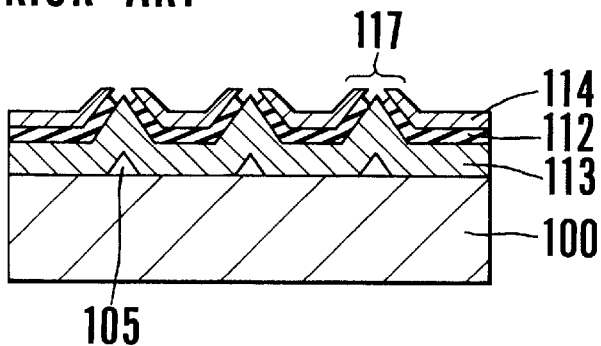

In the embodiment shown in FIGS. 3 and 4, the device has many current radiation regions 14. Some devices have only one current radiation region depending on applications. As is apparent from a comparison with the conventional device shown in FIG. 1, the gate electrode 13 in the current radiation region 14 is not deposited on the insulating film 12 to a uniform thickness, but is formed on the insulating film 12 to planarize the surface at almost the same level as that of the sharp tip of the emitter electrode 11. The use of the gate electrode 13 having such a shape increases the mechanical rigidity as compared with the conventional structure, as described in another patent application by the present inventor.

A recess portion 17 is formed in the structural substrate 10 at the bonding portion between the structural substrate 10 and the emitter electrode 11. As shown in FIG. 3, the recess portion 17 communicates with the external atmosphere through air throughs 120. For example, the recess portion 17 has a size of about 100 μm×100 μm×20 μm, and occupies a large region including all the current radiation regions 14. For example, each air through 120 is an elongated groove having a width of about 10 μm and a depth of about 20 μm. In this embodiment, the two air throughs 120 are formed in the upper and lower halves of the recess portion 17. In principle, however, it suffices if the device has one air through 120. In addition, the air through 120 can be formed at any position as long as it allows the recess portion 17 to communicate with the external atmosphere. With the formation of the recess portion 17 communicating with the external atmosphere, the influences of air trapped in voids, which pose problems in the conventional device, can be eliminated.

A frame-like support structure 16 is formed on the gate electrode 13 to surround the current radiation regions 14. The recess portion 17 is located inside the region surrounded by the support structure 16. With this structure, the peripheral portion of the emitter electrode 11 positioned under the region surrounded by the support structure 16 can be kept in contact with the upper surface of the structural substrate 10. This contact surface allows the emitter electrode 11 and the structural substrate 10 to be bonded to each other.

Since the support structure 16 can be manufactured to have a thickness of about 100 μm (to be described in detail later), the thickness of the structure 16 is much larger than that (e.g., about 2.3 μm) of the three-layered thin film structure consisting of the emitter electrode 11, the insulating film 12, and the gate electrode 13. By using the support structure 16 as a frame, therefore, the mechanical strength of the three-layered thin film structure can be greatly increased. For this reason, even with the presence of the recess portion 17 and the air through 120, which constitute a region which is not bonded to the emitter electrode 11, between the structural substrate 10 and the emitter electrode 11, the overall structure of the device can have a sufficient strength.

In this embodiment, as shown in FIG. 3, a taper 121 with an inclination of 54.7° is formed on the inside of the support structure 16. This taper 121 is formed on the basis of a low etching rate at the (111) plane of a silicon substrate when the support structure 16 is formed by etching the silicon substrate. The recess portion 17 may be formed to become larger than the one in this embodiment such that the side surfaces of the recess portion 17 are positioned under the support structure 16. With this structure, the same effects as those described above can be obtained.

As shown in FIGS. 3 and 4, an emitter contact pad 15 and a gate contact pad 19, both serving as means for externally supplying electrical signals to the emitter electrode 11 and the gate electrode 13, are formed on the peripheral portion of the structural substrate 10. Part of the emitter contact pad 15 is in direct contact with part of the emitter electrode 11. The gate contact pad 19 is in contact with a contact through 18 which is electrically connected to the gate electrode 13 via a through hole 130 formed in part of the insulating film 12. Since the contact through 18 is electrically isolated from the emitter electrode 11, different electrical signals can be supplied to the gate electrode 13 and the emitter electrode 11.

Each of these contact pads 15 and 19 formed on the structural substrate 10 is designed to have a three-layered thin film structure consisting of a 30-nm thick titanium film, a 20-nm thick platinum film, and a 250-nm thick gold film and also have a two-layered structure consisting of a 30-nm thick titanium film and a 20-nm thick platinum film in and near the region where the pad is in contact with the emitter electrode 11 or the contact through 18. The emitter electrode 11 and the contact through 18 can be respectively bonded to the emitter contact pad 15 and the gate contact pad 19 by using the force generated when the emitter electrode 11 is bonded to the structural substrate 10 in the region where no contact pads are present. Since the contact pads 15 and 19 are formed on the same surface of the structural substrate 10 in this manner, the lower surface (opposite to the surface having the recess portion 17) of the structural substrate 10 can be bonded to a package while the emitter electrode 11 and the gate electrode 13 can be electrically connected to pins of the package through the contact pads 15 and 19 on the upper surface of the structural substrate 10, thus facilitating packaging of the device.

Note that the gate electrode 13 consists of silicon in this embodiment, but can be formed by using various metal materials. In addition, even if the recess portion 17 is formed as a through hole in the structural substrate 10, the same effects as those of this embodiment can be obtained. In this case, although the air through 120 need not be formed, a structure allowing this through hole to communicate with the atmosphere outside the device chip must be formed in the package or on its surface.

In this embodiment, as the support structure 16, the continuous frame structure is used. However, the present invention includes a frame structure having a thin portion (or thin portions) or a discontinuous structure (e.g., a structure consisting of support structures on two opposite sides, or on the four sides with the members being separated from each other at the four corners in FIG. 3) as long as the same effects as those of the present invention can be obtained. Furthermore, if the frame structure of the support structure 16 includes a beam structure (e.g., one or plurality of horizontal support structures or one or plurality of cross-shaped support structures in the frame structure), the mechanical strength of the support structure 16 can be further increased. In this case, since the emitter electrode tips in the current radiation regions 14 must be formed so as not to overlap the beam structure formed in the frame structure, the overall size of the device increases in some degree. The environment in which the device is to be used must therefore be considered to determine whether to form a beam structure.

FIGS. 5A to 5F are sectional views sequentially showing the steps in a method of manufacturing the vacuum microdevice according to the first embodiment shown in FIGS. 3 and 4.

Figure 5A:
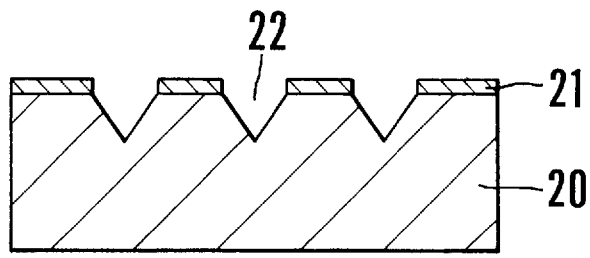
FIGS. 5A to 5F are sectional views sequentially showing the steps in a method of manufacturing the vacuum microdevice according to the first embodiment.
Figure 5B:
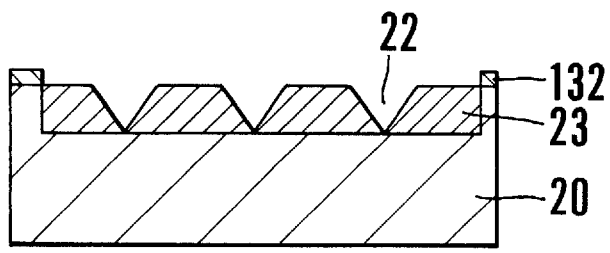

As shown in FIG. 5A, an oxide film 21 is formed on a silicon substrate 20, and opening portions, each having a size of 1 $\mu$m×1 $\mu$m, are formed. The silicon substrate 20 is etched by using an etching solution having anisotropy, e.g., KOH or a hydrazine solution to form mold holes 22 in the form of an inverted quadrangular pyramid. Subsequently, as shown in FIG. 5B, the oxide film 21 formed on the major surface in which the mold holes 22 are formed is patterned to form an oxide film 132. Boron is diffused at a high concentration by using the oxide film 132 as a mask to form a B diffusion layer 23. For example, this high-concentration diffusion of boron can be realized by placing a solid source to oppose the surface in which the mold holes 22 are formed, and heating the resultant structure in an atmosphere containing nitrogen gas and oxygen in an amount about 3 to 10% of the nitrogen gas flow rate at about 1,200° C.

This forming method has a specific feature in that the concentration of boron diffused in the pointed region in the bottom of each mold hole 22 is suppressed low. As a result, the boron concentration of the portion in the bottom of each mold hole becomes very low. After the above solid source diffusion, the surface of the silicon substrate 20 is covered with an oxide film containing a high concentration of boron and having a thickness of about 100 nm. This oxide film must therefore be completely removed by using hydrofluoric acid. In order to form an emitter electrode having sharp tips, this step is important for the following reason. An oxide film containing boron has a low melting point, and liquefies at about 700° C. in an atmosphere containing hydrogen, so that the bottom of each mold hole 22 is rounded in the subsequent oxidation process shown in FIG. 5C.

Figure 5C:
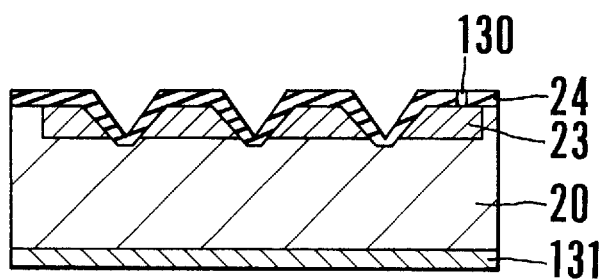
Figure 5D:
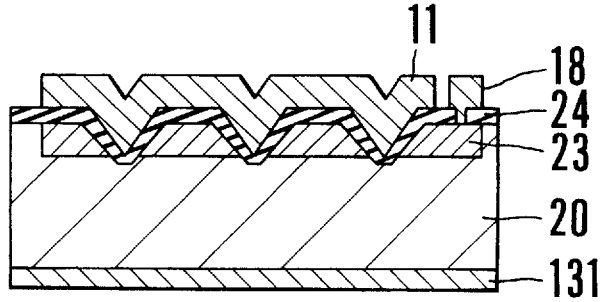
Figure 5E:
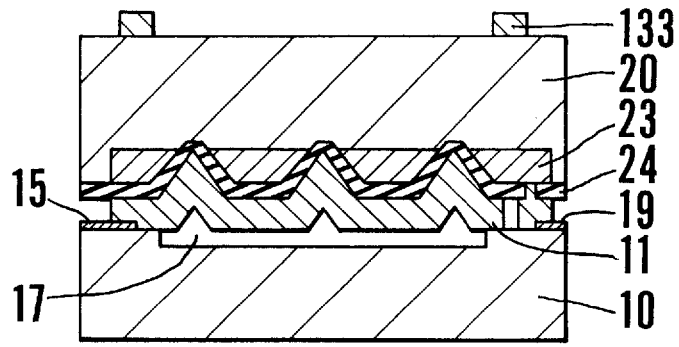
Figure 5F:
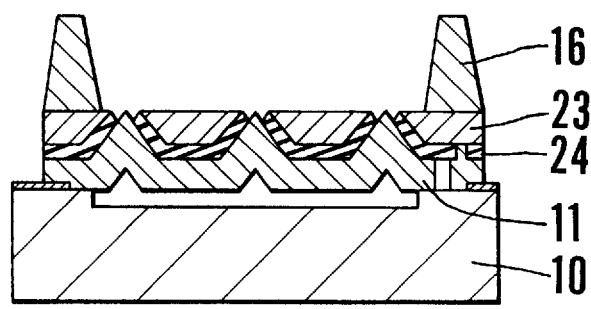

As shown in FIG. 5C, the sample is placed in an electric furnace to form an oxide film 24 on the B diffusion layer 23 and an oxide film 131 on the lower surface of the substrate 20. For example, each of the oxide films 24 and 131 has a thickness of about 300 nm. A through hole 130 reaching the B diffusion layer 23 is formed in a portion of the oxide film 24. As shown in FIG. 5D, the emitter electrode 11 is deposited on the oxide film 24. The emitter electrode 11 is partly patterned to isolate the contact through 18. As shown in FIG. 5E, the structural substrate 10 is brought into contact with the surface of the silicon substrate 20 on which the emitter electrode 11 is formed, and these substrates are bonded to each other. Note that the structure shown in FIGS. 5E and 5F is in an inverted position with respect to the structure shown in FIGS. 5A to 5D.

Although the steps in manufacturing the structural substrate 10 are not shown, the structural substrate 10 is manufactured by forming the recess portion 17 and the air through 120 in the surface of a glass substrate prepared independently of the silicon substrate 20. For example, the recess portion 17 and the air through 120 can be obtained by forming opening portions corresponding to the regions of the recess portion 17 and the air through 120 in the surface of the glass substrate coated with a resist, and etching the glass substrate to a depth of about 20 $\mu$m by using a glass etching solution such as hydrofluoric acid. Subsequently, titanium, platinum, and gold are deposited on the structural substrate 10 to thicknesses of 30 nm, 20 nm, and 250 nm, respectively, and the regions of the emitter contact pad 15 and the gate contact pad 19 are patterned. In addition, the gold films in the regions of the emitter contact pad 15 and the gate contact pad 19 which are to be respectively brought into contact with the emitter electrode 11 and the contact through 18 are removed.

If the structural substrate 10 is made of a glass material, the glass member can be firmly bonded to the emitter electrode 11 by electrostatic bonding. This electrostatic bonding has features in that a high bonding strength can be ensured, and no adhesive flows into the recess portion 17 and the air through 120 formed in the structural substrate 10 because no adhesive is used. If polysilicate glass (e.g., "Corning #7740") is used as a material for the structural substrate 10, and tantalum, molybdenum, or the like is used as a material for the emitter electrode 11, since these materials are similar in thermal expansion coefficient, a device with little strain can be obtained. Assume that an emitter electrode material which greatly differs in thermal expansion coefficient from the material for the structural substrate 10 is to be used. In this case, if, for example, a tantalum, molybdenum, or silicon film is used as a bonding layer after the emitter electrode 11 is formed, the resultant structure can be easily bonded to the structural substrate in the step shown in FIG. 5C. As described above, since the interior of the device communicates with the atmosphere outside the device through the recess portion 17 and the air through 120 formed in the structural substrate 10, the problem of trapping air in the step of bonding the structural substrate 10 to the silicon substrate 20 can be solved, thereby greatly facilitating the bonding step as compared with the prior art.

Subsequently, as shown in FIG. 5E, the oxide film 131 on the lower surface of the silicon substrate 20 is patterned to form an oxide film 133. As shown in FIG. 5F, the silicon substrate 20 is removed by placing the manufactured sample in a solution, such as a hydrazine solution, with which the etching rate depends on the boron concentration and the facet direction. As a result, a structure constituted by the support structure 16 having a side wall with an inclination of 54.7° with respect to the initial substrate surface and the B diffusion layer 23 serving as a gate electrode can be obtained.

In the step of etching the silicon substrate 20, the sample is wrapped with a proper holder or silicone or the like is applied to the inlet of the air through 120 to prevent the silicon etching solution from flowing into the recess portion 17 through the air through 120. In the method of using the holder, the air through 120 can communicate with the atmosphere outside the etching solution through an air hole formed in the holder. In the method of applying silicone, air is trapped in the recess portion 17, and the air expands when the etching solution is heated. In this embodiment, however, the mechanical strength of the structure can be increased with the three-layered structure consisting of the emitter electrode, the insulating film, and the gate electrode, and hence the device is resistant to rupture. Assume that many current radiation regions need to be formed, and this three-layered structure increases in size to make the device less resistant to rupture. Even in this case, if the support structure 16 includes a beam structure, a device having a sufficient mechanical strength can be provided. Finally, the sharp tips of the oxide film 24 are removed by using hydrofluoric acid to expose the tips of the emitter electrode 11.

In the above manufacturing method, the support structure 16 is equal in thickness to the silicon substrate 20. In this case, as the silicon substrate 20 becomes thicker, the area occupied by the support structure 16 increases. For this reason, the step of thinning the silicon substrate 20 by polishing it can be additionally performed after, e.g., the step shown in FIG. 3B.

According to the above manufacturing method, the thick two-layered structure consisting of the gate electrode, the oxide film, and the emitter electrode is formed instead of a thin two-layered structure consisting of an oxide film and an emitter electrode which is formed on a glass substrate as in the prior art. In addition, the thick support structure is formed around the three-layered structure. A device structure having a higher strength can therefore be obtained. Furthermore, since the support structure surrounds the current radiation regions at a level higher than that of the tips (current radiation regions) of the emitter electrode, damage to the current radiation regions during the manufacture of the sample can be prevented.

The above manufacturing method shown in FIGS. 5A to 5F is a device manufacturing method using no mask for preventing boron from being diffused into the mold holes 22 when a B diffusion layer is formed. According to this manufacturing method, since patterning is not performed near the mold hole region having non-flat portions, the device manufacturing process can be greatly simplified. Furthermore, a gate electrode having small openings (diameter: about 0.5 μm) can be formed around the sharp tips of the emitter electrode. As the size of each opening of the gate electrode decreases, the voltage to be applied to the device can be lowered.

Figure 6:
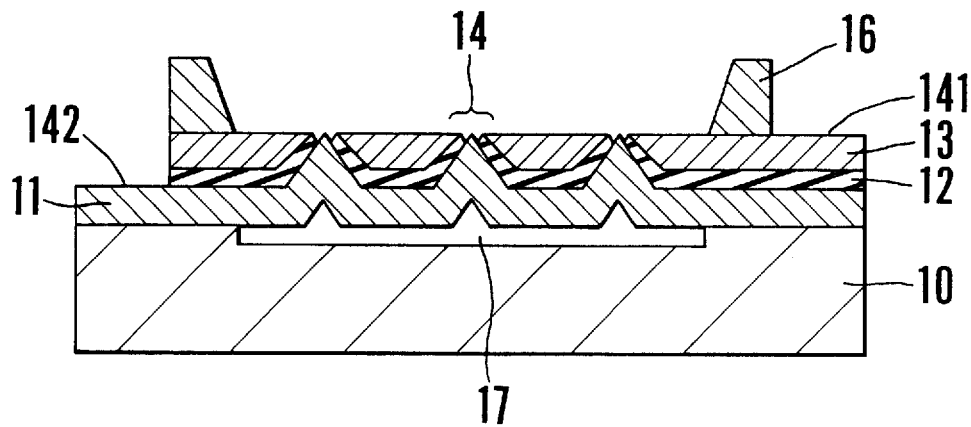
FIG. 6 is a sectional view showing the structure of a vacuum microdevice having a field-emission cold cathode according to the second embodiment of the present invention.

FIG. 6 is a sectional view showing a vacuum microdevice according to the second embodiment of the present invention. The same reference numerals in FIG. 6 denote the same parts as in FIGS. 4 and 5, which show the first embodiment, and hence a description thereof will be omitted. The structures of emitter and gate contact pads in the second embodiment differ from those in the first embodiment. An emitter contact pad 142 on the left side in FIG. 6 is formed by extending an emitter electrode 11 to the outside of a support structure 16. A gate contact pad 141 on the right side in FIG. 6 is formed by extending a gate electrode 13 formed on an insulating film 12 to the outside of the support structure 16. For example, these contact pads can be electrically connected to the pins of a package through thin aluminum lines. Compared to the first embodiment, the second embodiment requires no metal film pattern as contact pads on the structural substrate 10 and no contact through 18 (see FIG. 4) for electrical connection with the gate electrode 13, thereby simplifying the manufacturing process.

FIGS. 7A to 7F are sectional views sequentially showing the steps in a method of manufacturing a vacuum microdevice according to the second embodiment. The same reference numerals in FIGS. 7A to 7F denote the same parts as in FIGS. 5A to 5F.

Figure 7A:
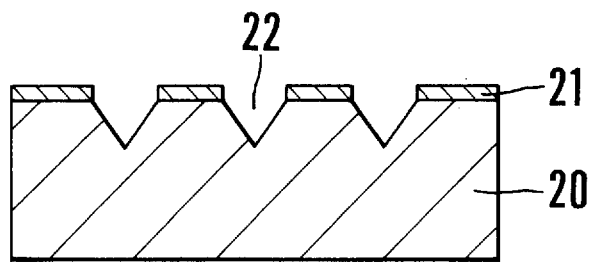
FIGS. 7A to 7F are sectional views sequentially showing the steps in a method of manufacturing the vacuum microdevice according to the second embodiment.
Figure 7B:
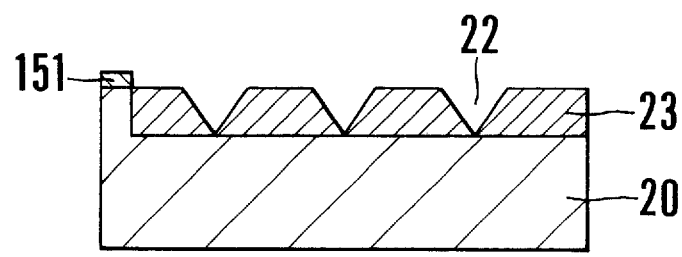

As shown in FIG. 7A, an oxide film 21 is formed on a silicon substrate 20, and opening portions, each having a size of 1 μm×1 μm, are formed. The silicon substrate 20 is etched by using an etching solution having anisotropy, e.g., KOH or a hydrazine solution to form mold holes 22 in the form of an inverted quadrangular pyramid. Subsequently, as shown in FIG. 7B, the oxide film 21 formed on the major surface in which the mold holes 22 are formed is patterned to form an oxide film 151. Boron is diffused at a high concentration by using the oxide film 151 as a mask to form a B diffusion layer 23. For example, this high-concentration diffusion of boron can be realized by placing a solid source to oppose the surface in which the mold holes 22 are formed, and heating the resultant structure in an atmosphere containing nitrogen gas and oxygen in an amount about 3 to 10% of the nitrogen gas flow rate at about 1,200° C. After the boron diffusion step using this solid source, the oxide film formed in each mold hole 22 is completely removed by using hydrofluoric acid.

Figure 7C:
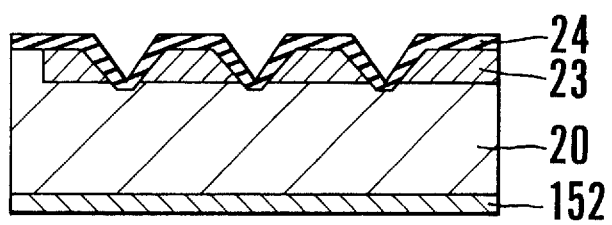
Figure 7D:
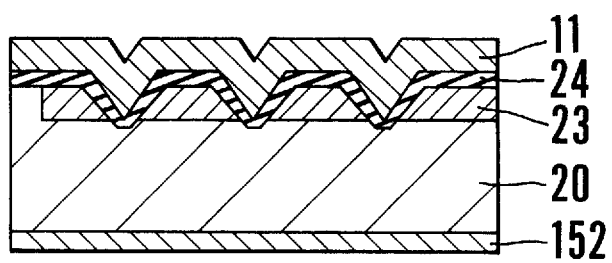

As shown in FIG. 7C, the sample is placed in an electric furnace to form an oxide film 24 on the B diffusion layer 23 and an oxide film 152 on the lower surface of the substrate 20. For example, each of the oxide films 24 and 152 has a thickness of about 300 nm. As shown in FIG. 7D, the emitter electrode 11 is deposited on the oxide film 24.

Figure 7E:
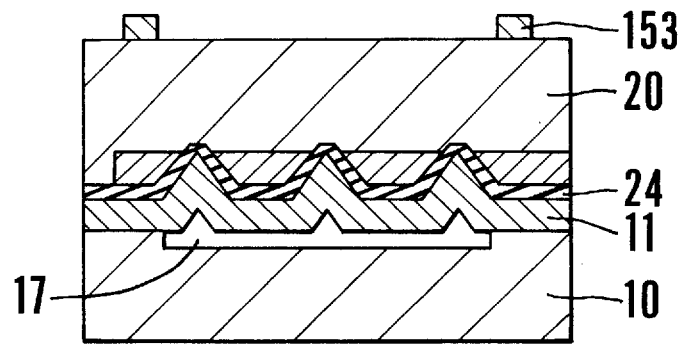

A structural substrate 10 having a recess portion 17 and an air through 120 (see FIG. 3) is formed in advance independently of the above silicon process. As shown in FIG. 7E, the structural substrate 10 is brought into contact with the surface of the silicon substrate 20 on which the emitter electrode 11 is formed, and these substrates are bonded to each other. If the structural substrate 10 is made of a glass material, the glass member can be firmly bonded to the emitter electrode 11 by the electrostatic bonding method. In this case, since the interior of the device communicates with the atmosphere outside the device through the recess portion 17 and the air through 120, the problem of trapping air inside the device in the bonding step can be solved. In addition, the oxide film 152 on the lower surface of the silicon substrate 20 is patterned to form an oxide film 153.

Figure 7F:
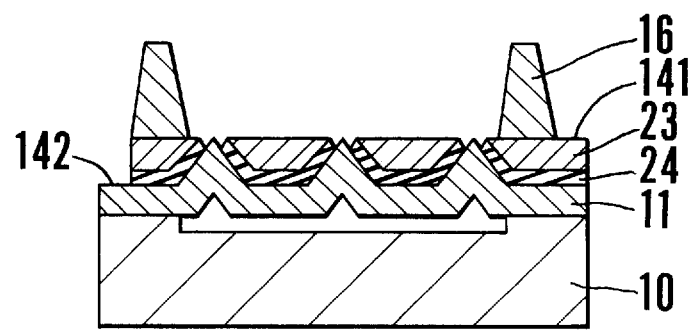

Subsequently, as shown in FIG. 7F, the silicon substrate 20 is removed by placing the manufactured sample in a solution, such as a hydrazine solution, with which the etching rate depends on the boron concentration and the facet direction. As a result, a structure constituted by the support structure 16 having a side wall with an inclination of 54.7° with respect to the initial substrate surface and the B diffusion layer 23 serving as a gate electrode can be obtained. At the same time, the contact pads 141 and 142 can be formed. Finally, the sharp tips of the oxide film 24 are removed by using hydrofluoric acid to expose the tips of the emitter electrode 11. Note that the structure shown in FIGS. 7E and 7F is in an inverted position with respect to the structure shown in FIGS. 7A to 7D.

Figure 8:
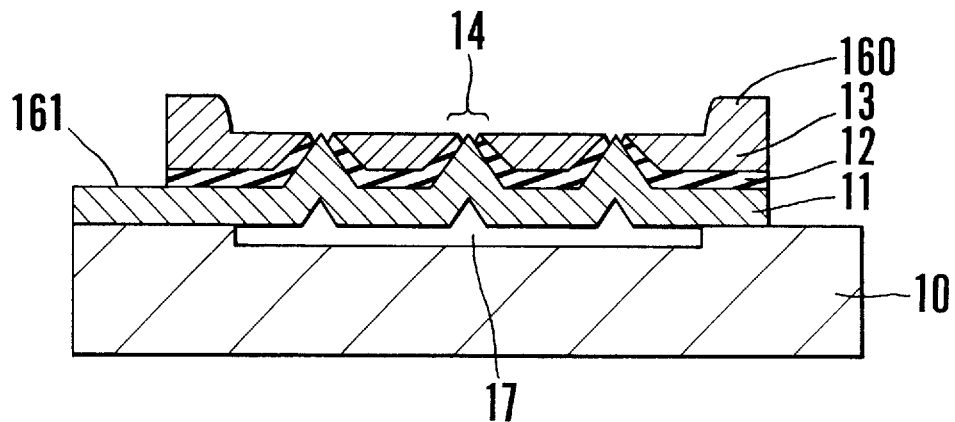
FIG. 8 is a sectional view showing the structure of a vacuum microdevice having a field-emission cold cathode according to the third embodiment of the present invention.

FIG. 8 is a sectional view showing a vacuum microdevice according to the third embodiment of the present invention. The same reference numerals in FIG. 8 denote the same parts as in FIGS. 4 and 5, which show the first embodiment, and hence a description thereof will be omitted. The structures of emitter and gate contact pads and support structures in the third embodiment differ from those in the first embodiment. As shown in FIG. 8, similar to a gate electrode 13, a support structure 160 consists of doped silicon. For this reason, the support structure 160 is electrically connected to the gate electrode 13 with a small resistance. In addition, as described in detail later, the shape of the side surface of the support structure 160 is similar to the diffusion profile of impurities.

In the third embodiment, the pins of a package are electrically connected to the gate electrode 13 by bonding aluminum wires to a flat region formed on the upper side of the support structure 160. An emitter contact pad 161 on the left side in FIG. 8 is formed by extending the emitter electrode 11 to the outside of the support structure 160. In the third embodiment, no complicated structure accompanying the contact pad is required, unlike in the first embodiment, and hence the structure can be greatly simplified. FIGS. 9A to 9G are sectional views sequentially showing the steps in a method of manufacturing a vacuum microdevice according to the third embodiment. The same reference numerals in FIG. 9 denote the same parts as in FIG. 5.

Figure 9A:
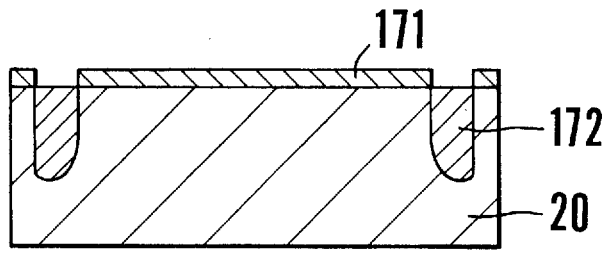
FIGS. 9A to 9G are sectional views sequentially showing the steps in a method of manufacturing the vacuum microdevice according to the third embodiment.
Figure 9B:
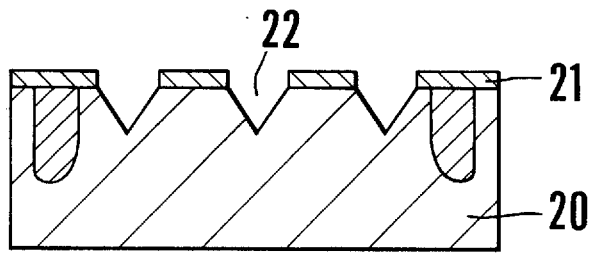
Figure 9C:
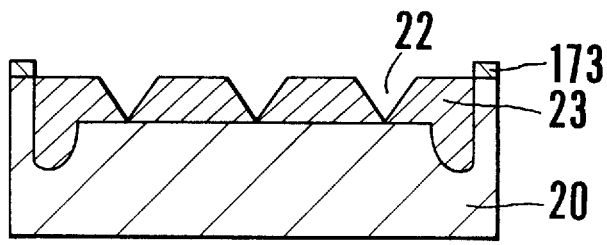

As shown in FIG. 9A, an oxide film 171 is formed on a silicon substrate 20, and an opening corresponding to the region of a support structure is formed. A B diffusion layer 172 is formed in this opening. In this boron diffusion step, if, for example, the sample is heated at 1,200° C. for about 20 hours, a support structure having a thickness of about 20 $\mu$m can be formed. As shown in FIG. 9B, the oxide film 171 is removed, and an oxide film 21 is formed on the silicon substrate 20. Thereafter, for example, opening portions, each having a size of 1 $\mu$m×1 $\mu$m, are formed. The silicon substrate 20 is etched by applying an etching solution having anisotropy, e.g., KOH or a hydrazine solution to this sample to form mold holes 22 in the form of an inverted quadrangular pyramid. Subsequently, as shown in FIG. 9C, the oxide film 21 formed on the major surface in which the mold holes 22 are formed is patterned to form an oxide film 173. Boron is diffused at a high concentration by using the oxide film 173 as a mask to form a B diffusion layer 23. For example, in this boron diffusion step, the sample is heated at 1,200° C. for about 20 minutes. In this case, a gate electrode 13 having a thickness of about 1 $\mu$m can be formed. After the boron diffusion step using this solid source, the oxide film formed in each mold hole 22 is completely removed by using hydrofluoric acid.

Figure 9D:
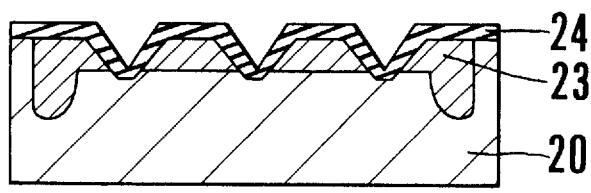
Figure 9E:
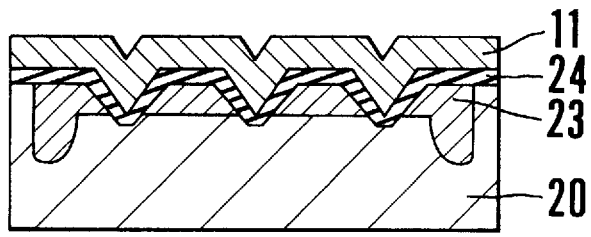

As shown in FIG. 9D, the sample is placed in an electric furnace to form an oxide film 24. For example, the oxide film 24 has a thickness of about 300 nm. As shown in FIG. 9E, an emitter electrode 11 is deposited on the oxide film 24.

Figure 9F:
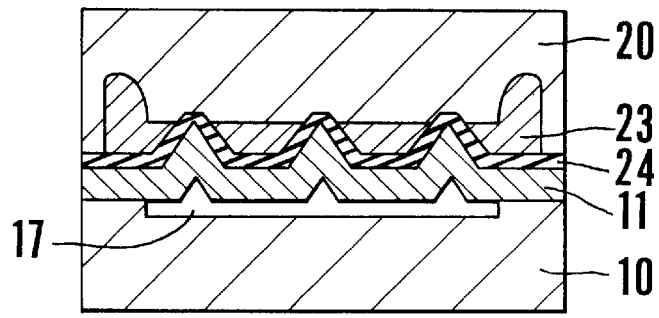

A structural substrate 10 having a recess portion 17 and an air through 120 (see FIG. 3) is formed in advance independently of the above silicon process. As shown in FIG. 9F, the structural substrate 10 is brought into contact with the surface of the silicon substrate 20 on which the emitter electrode 11 is formed, and these substrates are bonded to each other. If the structural substrate 10 is made of a glass material, the glass member can be firmly bonded to the emitter electrode 11 by the electrostatic bonding method. In this case, since the interior of the device communicates with the atmosphere outside the device through the recess portion 17 and the air through 120, the problem of entrapment of air inside the device in the bonding step can be solved.

Figure 9G:
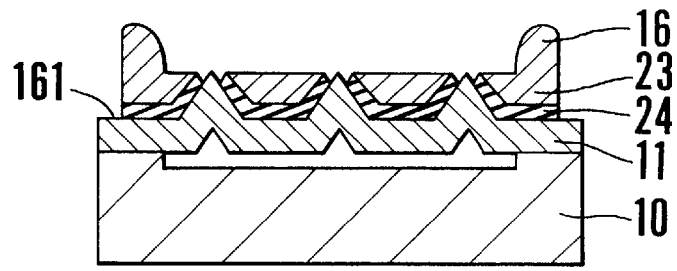

Subsequently, as shown in FIG. 9G, the silicon substrate 20 is removed by placing the manufactured sample in a solution, such as a hydrazine solution, with which the etching rate depends on the boron concentration and the facet direction. As a result, a structure constituted by the support structure 160 and the B diffusion layer 23 serving as a gate electrode can be obtained. At the same time, a contact pad 161 can be formed. Finally, the sharp tips of the oxide film 24 are removed by using hydrofluoric acid to expose the tips of the emitter electrode 11. As shown in FIG. 9G, in the device manufactured in this manner, the emitter electrode 11 extends to the outside of the support structure 160 on the right side of the device as well. For this reason, although the emitter contact pad 161 is formed on the left side in FIG. 8, the emitter contact pad 161 can be formed at an arbitrary position around the support structure 160 according to the manufacturing method shown in FIGS. 9A to 9G. Note that the structure shown in FIGS. 9F and 9G is in an inverted position with respect to the structure shown in FIGS. 9A to 9E.

Unlike the manufacturing methods of the first and second embodiments, the device manufacturing method of the third embodiment does not include the photolithographic step (see FIGS. 5E and 7E) for the lower surface of the silicon substrate. The manufacturing process can therefore be further simplified. In addition, since the thickness of the support structure 160 can be controlled by controlling the diffusion depth, a support structure 160 thinner than the silicon substrate 20 can be formed. Therefore, the step of polishing the silicon substrate 20 to decrease the region occupied by the support structure 16 in the first embodiment can be omitted. As described above, since the region occupied by the support structure 160 can be decreased, the mechanical strength of the device can be increased by adding the above beam structure without greatly increasing the device size.

Figure 10:
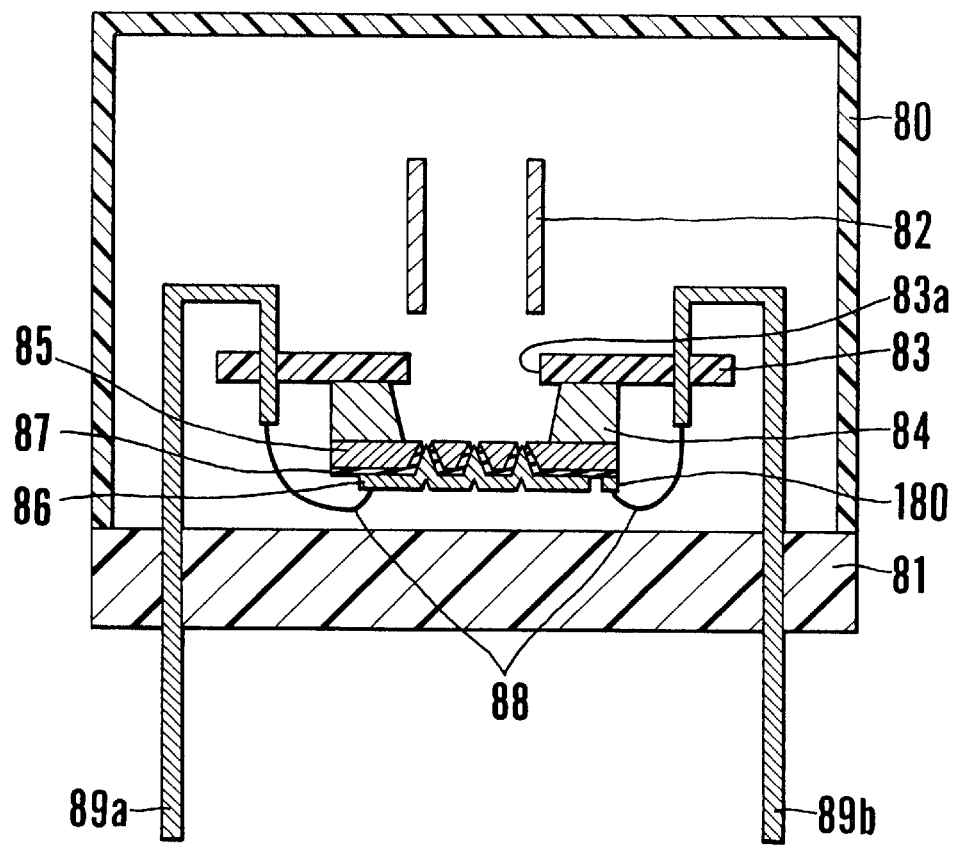
FIG. 10 is a sectional view showing the structure of a vacuum microdevice having a field-emission cold cathode and mounted in a package according to the fourth embodiment of the present invention.

FIG. 10 is a sectional view showing a state in which a device according to the fourth embodiment of the present invention is mounted in a package. The structures of emitter and gate contact pads and the position and shape of a structural substrate in the fourth embodiment differ from those in the first, second, and third embodiments. More specifically, the silicon portion of the device chip comprises a gate electrode 85, an insulating film 87, an emitter electrode 86, and a support substrate 84, but does not include the structural substrate 10 bonded to the emitter electrode as in the first to third embodiments (see FIGS. 4, 6, and 8). Instead of the structural substrate 10, this device includes the support substrate 84 corresponding to the support structure 16 in FIG. 4. The support substrate 84 is bonded to a structural substrate 83. A through hole 83a for guiding the flow of electrons emitted from the current radiation regions is formed in the middle portion of the structural substrate 83. In addition, this structural substrate 83 has pins 89a and 89b.

The fourth embodiment has features in that the device has no structural substrate bonded to the emitter electrode as in the first to third embodiments, and electrical signals are supplied from the lower surface of the device (i.e., the lower side in FIG. 10) to the gate electrode 85 and the emitter electrode 86. More specifically, electrical signals are supplied to the respective electrodes owing to electrical conduction from the emitter electrode to the pin 89a through a lead 88 and electrical conduction from a contact through 180 to the pin 89b through a lead 88. As shown in FIG. 10, the pins 89a and 89b are bent so as not to interfere with the flow of electrons emitted from the current radiation regions of the emitter electrode 86. The pins 89a and 89b extend outward through a stem 81. A cap 80 is bonded to the stem 81 to cover the device.

The cap 80 is set in a vacuum of $10^{-5}$ Torr or less to allow the device to stably operate. When a voltage is applied to the device such that the gate electrode 85 becomes positive with respect to the emitter electrode 86, electrons are emitted from the current radiation regions of the emitter electrode 86 into the vacuum. A voltage is then applied to a grid 82 (the illustration of the pin structure for applying the voltage is omitted from FIG. 10) such that the grid 82 becomes positive with respect to the gate electrode 85. With this operation, the emitted electron flow can be moved upward through the space inside the grid 82. By guiding this electron flow to a fluorescent screen or anode electrode, this device can be used as a display or signal amplifier (not shown). In the embodiment shown in FIG. 10, the pins 89a and 89b are bent at 180° to extend outward through the stem 81. However, these pins may take various shapes in accordance with actual applications. For example, the pins may be bent at 90° or may extend outward without being bent.

The steps shown in FIGS. 7A to 7D in the second embodiment are common to those in the manufacturing process for the vacuum microdevice according to the fourth embodiment. Thereafter, the support substrate 84 is formed in the same manner as in the step of forming the support structure by patterning the oxide film on the lower surface of the silicon substrate as shown in FIG. 7F, and the support substrate 84 is bonded to the structural substrate 83 having a through hole.

Although the structure of the package in the fourth embodiment is slightly complicated as compared with those in the first to third embodiments, the structure of the device itself is very simple. In addition, in the step of bonding the structural substrate 83 to the support substrate 84, the strain caused by the bonding operation exerts no direct influence on the thin three-layered structure consisting of the gate electrode 85, the insulating film 87, and the emitter electrode 86. Therefore, a device with stable characteristics can be provided. Furthermore, since no significant problem is posed even if an adhesive is used to bond the structural substrate 83 to the support substrate 84, the material for the structural substrate 83 can be selected from a wide range of choices.

In each of the manufacturing methods according to the first to third embodiments, the gate electrode is formed on the basis of the different etching rates of the high-concentration boron layer and the silicon substrate in an etching solution such as a hydrazine solution. This method allows easy control of the shape of the gate electrode, and greatly facilitates the manufacturing process, thereby realizing a low manufacturing cost. However, the present invention is not limited to the structure of this B diffusion layer gate electrode, and can be applied to structures having silicon gate electrodes which can be formed by various known forming methods, e.g., a forming method using an SOI substrate, a method of stopping the etching process at a pn junction interface upon application of a voltage, and a forming method using a porous silicon material.

In the vacuum microdevice of the present invention, since the factors that distort the relative positional relationship between the gate electrodes and the emitter electrode tips can be reduced, the characteristics of the device can be accurately controlled. When the electrical characteristics of a device manufactured by using molybdenum for emitter electrodes were measured, a current of 100 μA was emitted from 100 arrays upon application of a voltage of 40 V unlike the conventional device in which the same current was emitted upon application of 100 V. The reason for this effect may be attributed to the improved characteristics of each current radiation region, which, in turn, cause emission of a larger number of electrons therefrom than from the current radiation regions of the conventional device. As described above, there is provided a device which can obtain a large current at a low applied voltage. In addition, even when the device was driven for a long period of time, no considerable deterioration in device characteristics were observed. The reason for this effect may be ascribed to the fact that the degree of vacuum of the package did not decrease.

What I claim is:

1. A vacuum microdevice comprising:
   a first electrode having a projection portion formed on a surface thereof, the projection having a sharp tip;
   an insulating film formed in a region of said first electrode, excluding the sharp tip of the projection portion;
   a second electrode formed in a region on said insulating film, excluding the sharp tip of the projection portion, to planarize a surface of said second electrode; and
   a structural substrate bonded to a lower surface of said first electrode and having a recess portion in a bonding surface with the lower surface of said first electrode, the recess portion having a size large enough to cover a recess reflecting the sharp tip of the projection portion formed on the lower surface of said first electrode.

2. A device according to claim 1, wherein an interior of the recess portion formed in said structural substrate communicates with an atmosphere outside said device.

3. A device according to claim 1, further comprising a support structure formed on a surface of said second electrode to surround the projection portion formed on said first electrode.

4. A device according to claim 3, wherein said support structure consists of a semiconductor and has a (111) side surface.

5. A device according to claim 3, wherein said support structure is made of part of an impurity-diffused layer forming said second electrode.

6. A device according to claim 1, wherein said structure comprises a glass substrate.

7. A device according to claim 1, wherein said first electrode is connected to a metal electrode formed on said structural substrate, said second electrode is connected to another metal electrode formed on said structural substrate through a hole formed in said insulating film, and electrical signals are supplied to said first and second electrodes through said metal electrodes.

8. A device according to claim 1, wherein portions of said first and second electrodes are extended outward to be exposed on a surface side different from a surface to which said structural substrate is bonded, and electrical signals are supplied to said first and second electrodes through the exposed regions.

9. A device according to claim 5, wherein a portion of said second electrode is extended to be exposed on a surface side different from a surface to which said structural substrate is bonded, an electrical signal is supplied to said second electrode through the exposed region, and an electrical signal is supplied to said first electrode through said support structure formed on said first electrode.

10. A vacuum microdevice comprising:
   a first electrode having a projection portion formed on a surface thereof, the projection having a sharp tip;
   an insulating film formed in a region of said first electrode, excluding the sharp tip of the projection portion;
   a second electrode formed in a region on said insulating film, excluding the sharp tip of the projection portion, to planarize a surface of second electrode;
   a support substrate formed on a surface of said second electrode; and
   a structural substrate having pins and a recess portion, said structural substrate bonded to the support structure,
   wherein electrical signals are supplied to the second electrode and the first electrode by the pins of the structural substrate.

* * * * *